(12) United States Patent
Hung et al.

(10) Patent No.: US 7,561,417 B2
(45) Date of Patent: Jul. 14, 2009

(54) THERMAL MODULE AND FIN ASSEMBLY THEREOF

(75) Inventors: Jui-Wen Hung, Taipei Hsien (TW); Ching-Bai Hwang, Taipei Hsien (TW); Jie Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 53 days.

(21) Appl. No.: 11/940,956

(22) Filed: Nov. 15, 2007

(65) Prior Publication Data

US 2009/0046428 A1 Feb. 19, 2009

(30) Foreign Application Priority Data

Aug. 17, 2007 (CN) .................. 2007 1 0076402

(51) Int. Cl.
*H05K 7/20* (2006.01)
(52) U.S. Cl. .................. 361/679.52; 361/679.47; 361/690; 361/695; 361/697; 165/80.3; 165/119; 165/122; 165/146; 165/104.33
(58) Field of Classification Search .......... 361/687, 361/690–697, 700–712, 719–722, 732, 831; 165/80.2, 80.3, 80.4, 80.5, 119–122, 104.21, 165/104.33, 104.34, 185; 62/259.2; 257/713–722
See application file for complete search history.

(56) References Cited

U.S. PATENT DOCUMENTS

| | | | | |
|---|---|---|---|---|
| 5,109,919 A | * | 5/1992 | Sakuma et al. | 165/151 |
| 5,697,432 A | * | 12/1997 | Yun et al. | 165/151 |
| 6,227,289 B1 | * | 5/2001 | Yokoyama et al. | 165/151 |
| 6,382,307 B1 | * | 5/2002 | Wang et al. | 165/80.3 |
| 6,651,733 B1 | * | 11/2003 | Horng et al. | 165/80.3 |
| 6,804,115 B2 | * | 10/2004 | Lai | 361/695 |
| 6,867,971 B2 | * | 3/2005 | Lai | 361/697 |
| 6,882,532 B2 | * | 4/2005 | Chen et al. | 361/690 |
| 7,021,370 B2 | * | 4/2006 | Papapanu et al. | 165/151 |
| 7,120,026 B2 | * | 10/2006 | Chen | 361/704 |
| 7,128,131 B2 | * | 10/2006 | Kubo | 165/80.3 |
| 7,212,404 B2 | * | 5/2007 | Wang et al. | 361/697 |
| 7,409,983 B2 | * | 8/2008 | Lin | 165/80.3 |
| 7,466,548 B2 | * | 12/2008 | Ishikawa | 361/698 |
| 7,474,526 B2 | * | 1/2009 | Fujiwara | 165/104.21 |
| 2003/0161102 A1 | | 8/2003 | Lee et al. | |
| 2004/0105233 A1 | * | 6/2004 | Lai | 361/695 |
| 2007/0131383 A1 | * | 6/2007 | Hattori et al. | 165/11.2 |
| 2007/0177350 A1 | * | 8/2007 | Hata et al. | 361/697 |

* cited by examiner

*Primary Examiner*—Michael V Datskovskiy

(57) ABSTRACT

A thermal module includes a centrifugal fan (10), a fin assembly (20) disposed at an air outlet of the centrifugal fan and two heat pipes (30, 40). The fin assembly includes a plurality of fins (21) connected together. Each fin has a front surface (212) and a rear surface (213) opposite the front surface. An elongated protruding member (218) is formed on the fin and protrudes from the rear surface towards the front surface. A recessed concave (219) corresponding to the protruding member is defined in the rear surface of the fin. At least one slit is defined along the protruding member and communicates with the concave. The protruding member divides the fin into first and second fin portions (20a, 20b). The two heat pipes thermally interconnect the first and second fin portions with two heat generating electronic components, respectively.

20 Claims, 9 Drawing Sheets

THERMAL MODULE AND FIN ASSEMBLY THEREOF

BACKGROUND OF THE INVENTION

1. Field of the Invention

The present invention relates generally to a fin assembly, and more particularly to a thermal module incorporating the fin assembly for dissipating heat generated by electronic components.

2. Description of Related Art

With the fast development of the electronics industry, advanced electronic components such as CPUs (central processing units), or VGA (video graphics array) cards are being made with ever faster operating speeds. During operation of the advanced electronic components, a large amount of heat is generated. Greater emphasis is now being laid on increasing the efficiency and effectiveness of heat dissipation devices so as to keep operational temperature of the advanced electronic components within a suitable range. In laptop computers, thermal modules are commonly used to cool advanced electronic components contained in the computers. Therefore, great emphasis is laid on improving the efficiency and effectiveness of the thermal modules for the advanced electronic components.

Since the laptop computers do not have enough space therein for containing multiple thermal modules, a thermal module is generally used for simultaneously dissipating heat generated by multiple heat-generating advanced electronic components of the laptop computer, such as, a CPU and a GPU (graphic processing unit). However, the operating speeds of the two heat-generating advanced electronic components are generally different from each other, and therefore the amount of heat generated by the two heat-generating advanced electronic components are also different. For example, the CPU may generate much more heat than the GPU within a certain identical period. Generally, the thermal module adopts a fin assembly to dissipate heat generated by both of the CPU and the GPU. If the heat of the CPU transferred to the fin assembly is not effectively and timely dissipated, that portion of heat of the CPU that is not timely dissipated may be transferred back to the GPU which has a lower temperature, thus inducing heat transfer between the two heat-generating advanced electronic components, since both of them are thermally connected to the fin assembly of the thermal module. Therefore, a thermal module having a better heat dissipation efficiency and suitable for simultaneously dissipating heat of multiple heat sources is needed.

SUMMARY OF THE INVENTION

The present invention relates, in one aspect, to a fin assembly. According to a preferred embodiment of the present invention, the fin assembly includes a plurality of fins stacked together. A flow channel is formed between every two neighboring fins for an airflow flowing therethrough. An elongated protruding member is arranged substantially at a central portion of each of the fins and protrudes above a front surface of the fin. A recessed concave corresponding to the protruding member is defined in a rear surface of the fin. A slit is defined along the protruding member and communicates with the concave. The protruding member divides the fin into first and second fin portions and blocks heat transfer between the first and second fin portions through the slit and the concave. The first fin portion is used for receiving heat from a first heat pipe and the second fin portion is used for receiving heat from a second heat pipe.

The present invention relates, in another aspect, to a thermal module for simultaneously dissipating heat generated by at least two heat-generating electronic components in an electronic device. According to a preferred embodiment of the present invention, the thermal module includes a centrifugal fan, a fin assembly and two heat pipes. The centrifugal fan defines an air outlet therein. An airflow generated by the fan leaves the fan through the air outlet. The fin assembly is disposed at the air outlet and includes a plurality of fins connected together. Each fin has a front surface and a rear surface. A flow channel is defined between every two neighboring fins for the airflow flowing therethrough. A protruding member is formed on the fin and divides the fin into first and second fin portions. A recessed concave is defined in the fin corresponding to the protruding member. A slit is defined along the protruding member and communicates with the concave. The protruding member blocks heat transfer between the first and second fin portions through the slit and the concave. The two heat pipes thermally connect with the first and second fin portions of the fin. The two heat pipes are adapted for thermally connecting with two heat generating electronic components, respectively.

Other advantages and novel features of the present invention will become more apparent from the following detailed description of preferred embodiment when taken in conjunction with the accompanying drawings, in which:

DETAILED DESCRIPTION OF THE INVENTION

Figure 1:
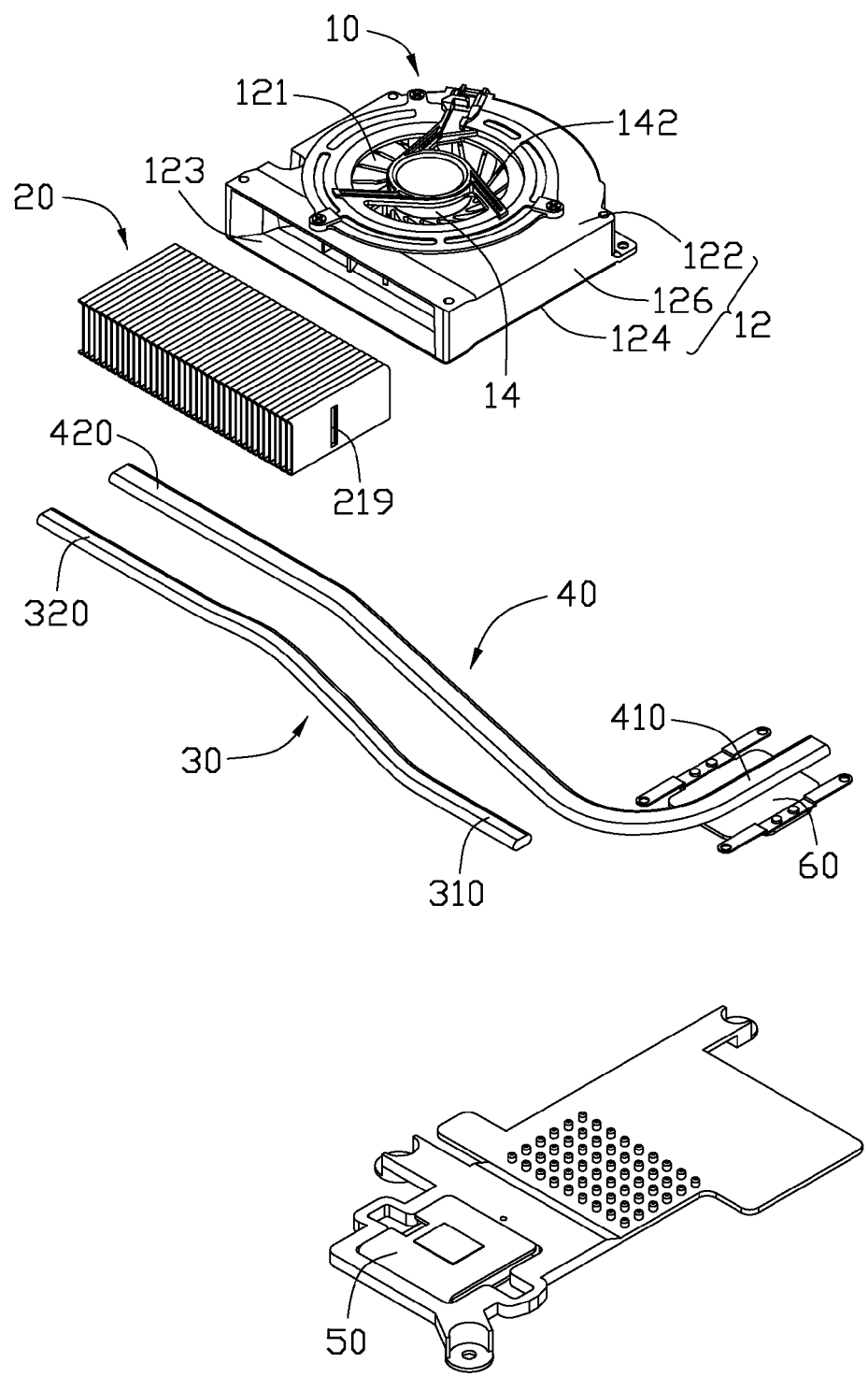
FIG. 1 is an exploded, isometric view of a thermal module according to a preferred embodiment of the present invention.
Figure 2:
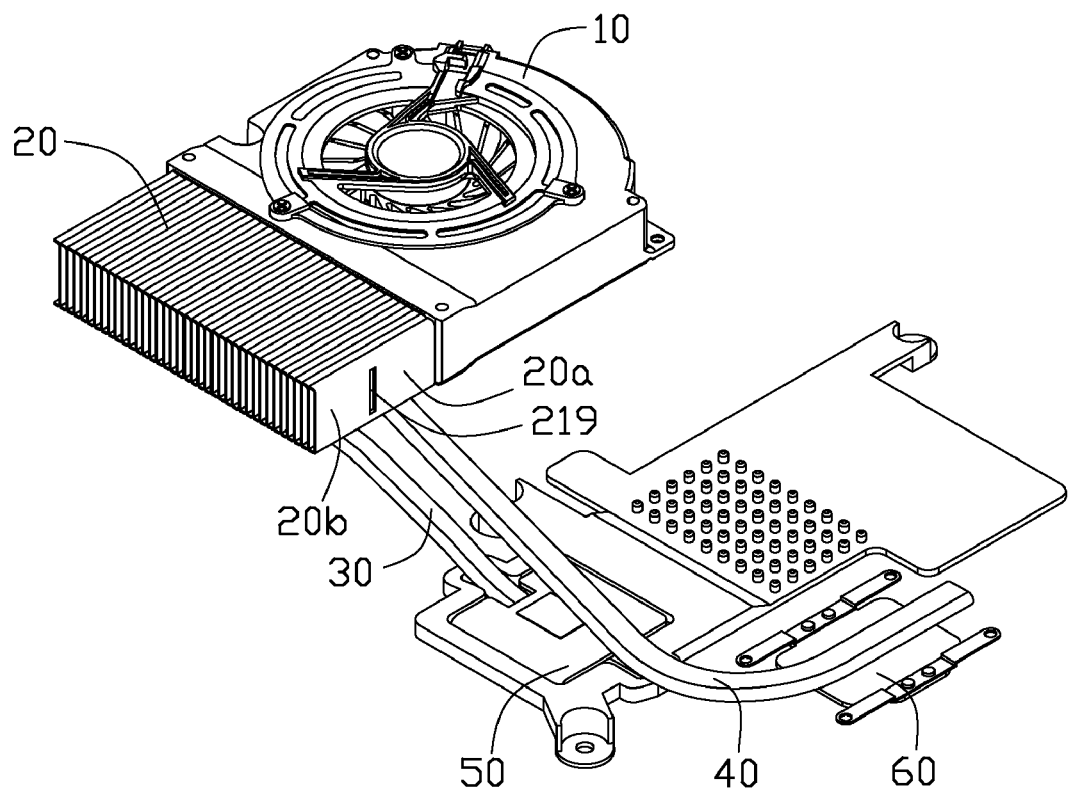
FIG. 2 is an assembled view of the thermal module of FIG. 1.

Referring to FIG. 1 and FIG. 2, a thermal module according to a preferred embodiment of the present invention is shown. The thermal module is used for dissipating heat generated by primary and secondary heat generating electronic components of a portable electronic product such as a laptop computer, a notebook computer or a DVD player. In accordance with the preferred embodiment, the primary electronic component is a CPU (central processing unit) of a laptop computer, while the secondary electronic component is a GPU (graphic processing unit) of a video graphics array (VGA) card of the laptop computer. The thermal module includes a centrifugal fan 10, a fin assembly 20, first and second heat pipes 30, 40, and first and second metal blocks 50, 60.

The centrifugal fan 10 is used to provide an airflow passing through the fin assembly 20. The centrifugal fan 10 includes a housing 12 and a motor 14 contained in the housing 12. The motor 14 has a plurality of blades 142 extending radially and outwardly from an outer periphery thereof. The blades 142 are contained in the housing 12 and driven by the motor 14 to rotate to generate the airflow when the fan 10 operates. The housing 12 includes a top cover 122 arranged at a top side of the motor 14, a bottom cover 124 paralleled to the top cover 122 and arranged at a bottom side of the motor 14, and a sidewall 126 interconnecting the top and bottom covers 122, 124 and surrounding the motor 14. The two covers 122, 124 and the sidewall 126 cooperatively define an inner space (not labeled) for receiving the motor 14 therein. An air inlet 121 is defined in a central portion of each of the top cover 122 and the bottom cover 124. An air outlet 123 is defined in one side of the sidewall 126 of the housing 12 and is oriented perpendicularly to the air inlet 121.

Figure 3:
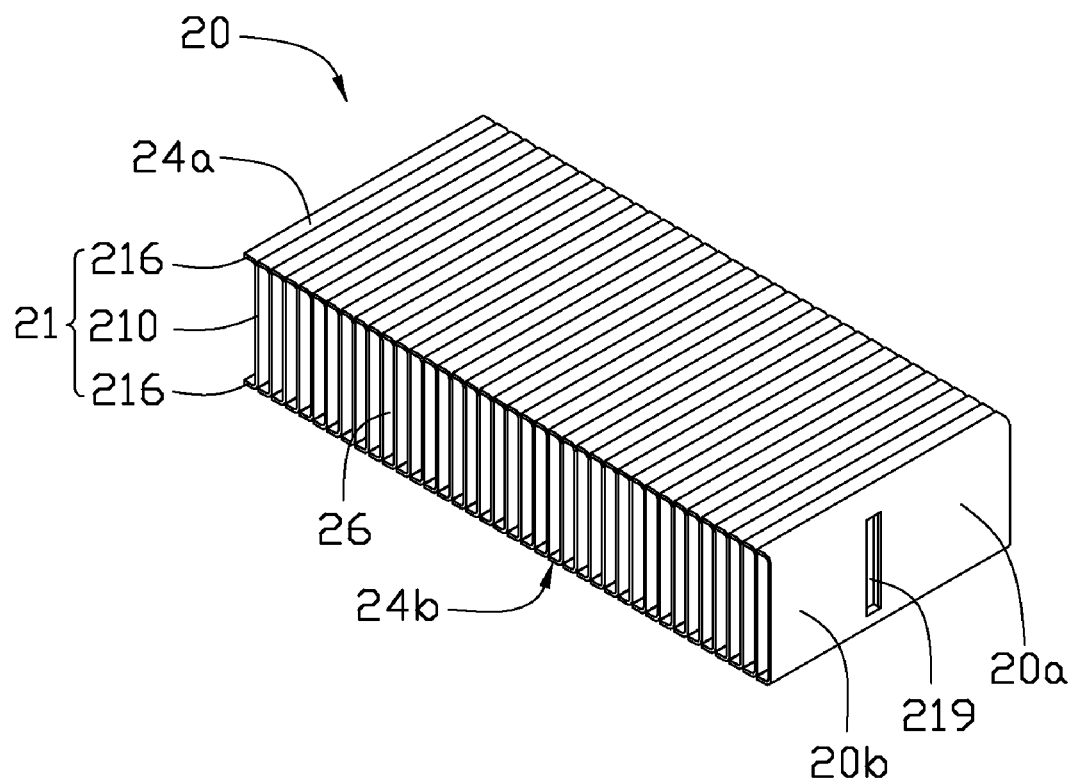
FIG. 3 is an enlarged view of a fin assembly of the thermal module shown in FIG. 1.
Figure 4:
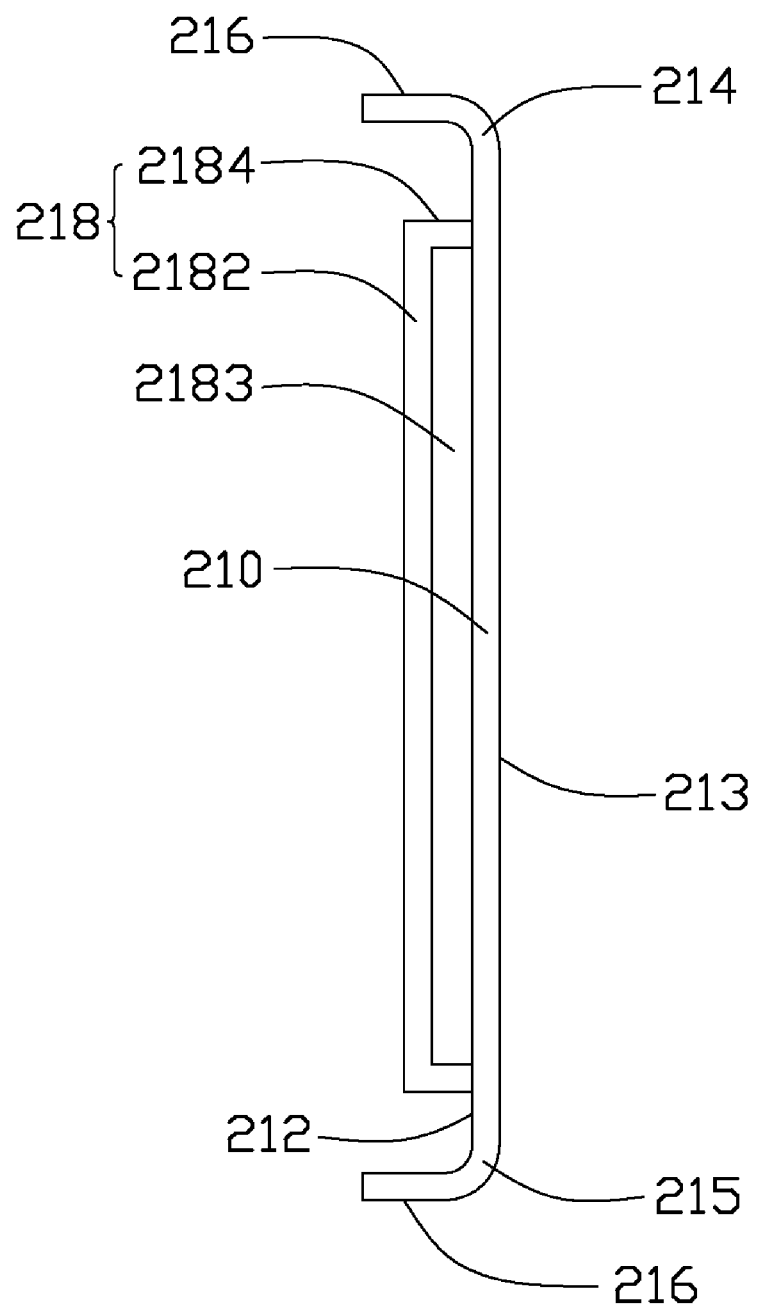
FIG. 4 is a side view of a fin of the fin assembly of FIG. 3.
Figure 5:
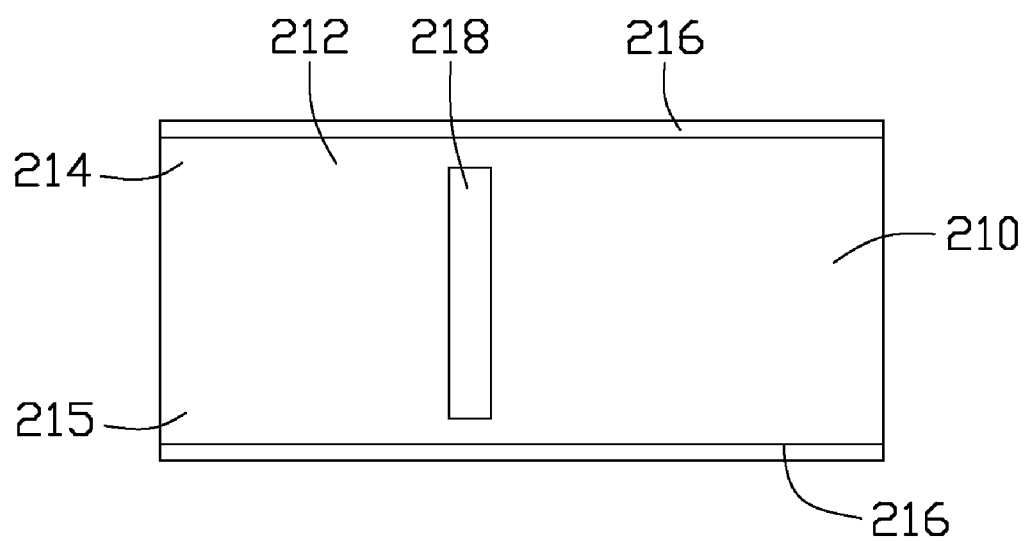
FIG. 5 is a front view of the fin of FIG. 4.

The fin assembly 20 is arranged at the air outlet 123 of the centrifugal fan 10. As shown in FIG. 3, the fin assembly 20 includes a plurality of fins 21 stacked together and has a cuboid profile so as to match with the air outlet 123 of the centrifugal fan 10. As shown in FIGS. 3 and 4, each of the fins 21 includes a rectangular-shaped main body 210 which has a front surface 212 and a rear surface 213, two flanges 216 perpendicularly bent from top and bottom ends 214, 215 of the main body 210, and an elongated protruding member 218 extending outwardly from a central potion of the main body 210. When the fin assembly 20 is assembled together, the flanges 216 of a rear fin 21 engage with the main body 210 of a front fin 21, thus forming two contacting surfaces 24a, 24b at the top and bottom sides of the fin assembly 20, respectively. A flow channel 26 is formed between every two neighboring fins 21 to guide the airflow generated by the centrifugal fan 10 to flow through the fin assembly 20.

To simplify manufacturing, the protruding member 218 is preferably formed by punching the main body 210 of each fin 21 from the rear surface 213 towards the front surface 212. A recessed concave 219 corresponding to each of the protruding members 218 is therefore formed in the rear surface 213 of each fin 21 after the punching process. The protruding member 218 is U-shaped, which includes an elongated strip 2182 parallel to the main body 210 and two connecting tabs 2184 extending perpendicularly from top and bottom sides of the strip 2182, respectively, to connect with the main body 210. The connecting tabs 2184 at the top and bottom sides of the strip 2182 are parallel to and spaced a small distance from the top and bottom flanges 216, respectively. A windward side and a leeward side of the strip 2182 are each provided with an elongated slit 2183, so that two neighboring flow channels 26 of the fin assembly 20 communicate with each other through the concave 219 and the slits 2183.

A height of each of the connecting tabs 2184 of the protruding member 218 is less than a height of each of the flanges 216. That is, the protruding member 218 has a protruding height smaller than a width of each of the flow channels 26 between the fins 21. When the fin assembly 20 is assembled together, the strip 2182 of the protruding member 218 is spaced a distance from the rear surface 213 of an adjacent fin 21. The protruding member 218 is located substantially at a central portion of each fin 21, and extends vertically between the bottom flange 216 and the top flange 216. As a result, each fin 21 of the fin assembly 20 is separated by the protruding member 218 into a first half fin portion 20a and a second half fin portion 20b along a flowing direction of the airflow. The fin portion 20a is located near to a windward side of the airflow, while the portion 20b is located at a leeward side of the airflow.

The first heat pipe 30 is substantially straight in profile, whilst the second heat pipe 40 is substantially L-shaped in profile. The heat pipe 30 includes an evaporator section 310 at one end and a condenser section 320 at the other end thereof. Similarly, the heat pipe 40 includes an evaporator section 410 at one end and a condenser section 420 at the other end thereof. The evaporator section 310 of the first heat pipe 30 thermally connects with the first metal block 50 so as to absorb heat transferred to the metal block 50. The condenser section 320 of the first heat pipe 30 thermally contacts the bottom contacting surface 24b at a position corresponding to the second fin portion 20b of the fin assembly 20 so as to transfer the heat from the metal block 50 to the fin assembly 20. The evaporator section 410 of the second heat pipe 40 thermally connects with the second metal block 60 so as to absorb heat transferred to the metal block 60. The condenser section 420 of the second heat pipe 40 thermally contacts with the bottom contacting surface 20b at a position corresponding to the first fin portion 20a of the fin assembly 20 so as to transfer the heat from the metal block 60 to the fin assembly 20. Each of the first and second metal blocks 50, 60 absorbs heat from one of the primary and secondary electronic components. In the present embodiment, the first metal block 50 contacts with the secondary electronic component which is a GPU, while the second metal block 60 contacts with the primary electronic component which is a CPU.

In the present thermal module, the first and second heat pipes 30, 40 are flattened so as to provide a larger contact area with the bottom contacting surface 24b of the fin assembly 20, and the heat generated by the primary and secondary heat generating electronic components is released by the fin assembly 20 effectively and quickly. The fin assembly 20 in accordance with the preferred embodiment of the present invention is provided with a plurality of protruding members 218 arranged on the fins 21. Each of the protruding members 218 defines the concave 219 in the main body 210 and is provided with the slits 2183 at the windward and leeward sides of the airflow. Therefore, heat transfer between the first and second fin portions 20a, 20b are effectively blocked by the protruding member 218. That is, the heat transferred to the first fin portion 20a is blocked from being transferred to the second fin portion 20b due to the existence of the protruding member 218, or vice versa. When the condenser sections 320, 420 of the first and second heat pipes 30, 40 simultaneously contact with the bottom contacting surface 24b of the fin assembly 20, the first heat pipe 30 transfers the heat generated by the secondary electronic component, i.e., the GPU, to the second fin portion 20b, while the second heat pipe 40 transfers the heat generated by the primary electronic component, i.e., the CPU, to the first fin portion 20a. Since the first and second fin portions 20a, 20b are independent of each other as to heat dissipation, the heat generated by the CPU and the heat generated by the GPU are dissipated respectively by the first and second fin portions 20a, 20b. If the CPU generates a much larger amount of heat than the GPU, the heat of the CPU transferred to the first fin portion 20a of the fin assembly 20 will accordingly be much more than the heat of the GPU transferred to the second fin portion 20b. Since heat transfer between the first and second fin portions 20a, 20b are effectively blocked by the protruding member 218, the heat of the CPU will not be transferred from the first fin portion 20a to the second fin portion 20b, and then transferred through the first heat pipe 30 back to the GPU, which may cause damage to the GPU due to a too high temperature.

Furthermore, the protruding member 218 extended into the flow channel 26 will cause an air turbulence for the airflow when the airflow flows through the flow channel 26, which makes the airflow take more heat away from the fin assembly 20. Moreover, the airflow flowing through one flow channel 26 is also guided to a neighboring flow channel 26 through the slits 2183 and the concave 219 of the protruding member 218. This further enhances turbulence of the airflow and improves heat exchange of the airflow between adjacent fins 21. Heat exchange between the airflow and the fins 21 is therefore improved.

Figure 6:
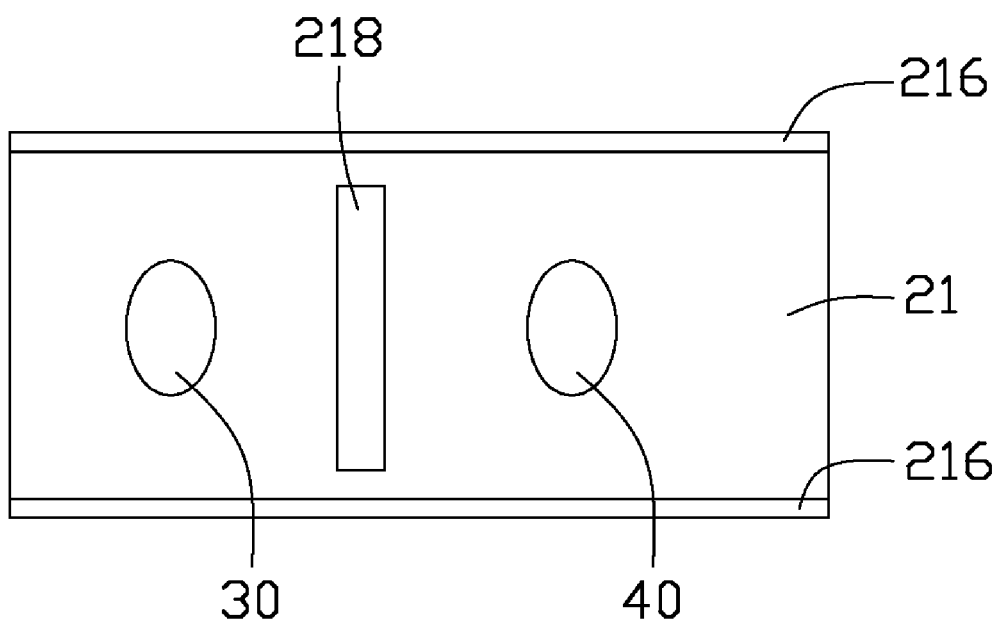
FIG. 6 is a front view of a fin in accordance with a second embodiment of the present invention.
Figure 7:
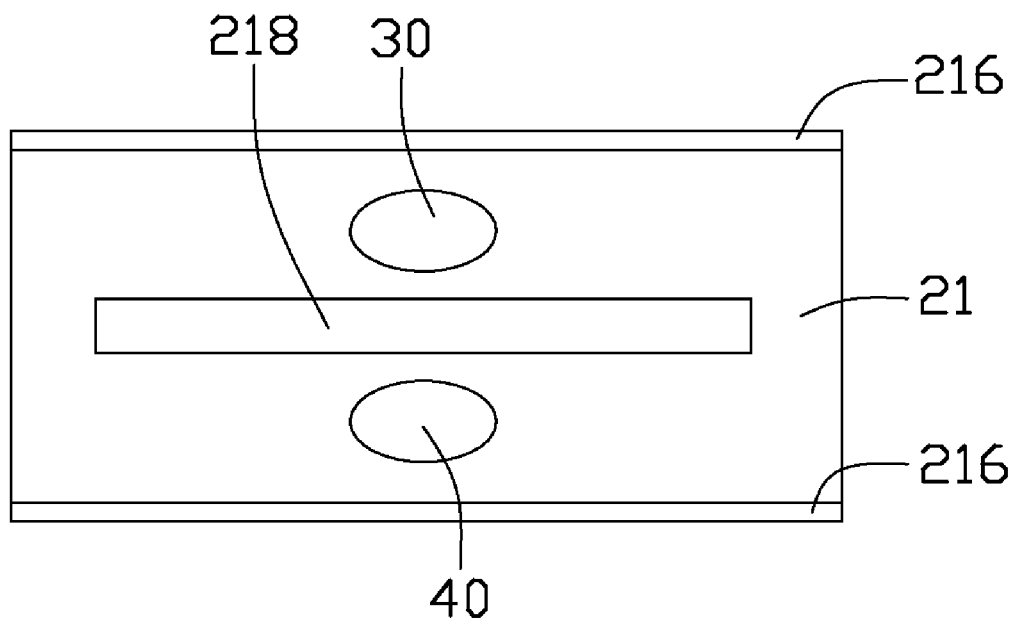
FIG. 7 is a front view of a fin in accordance with a third embodiment of the present invention.
Figure 8:
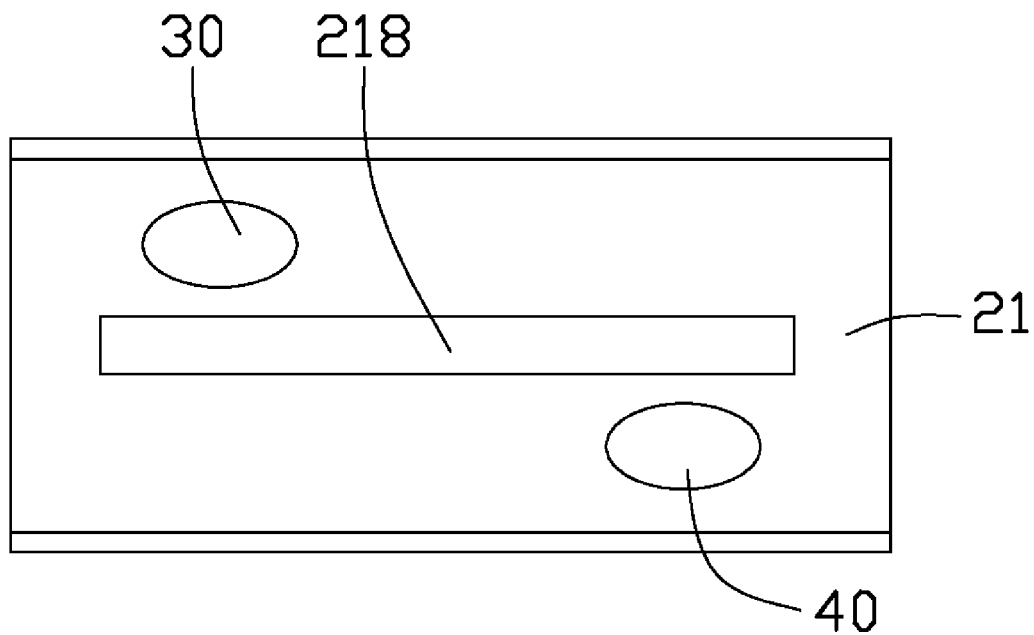
FIG. 8 is a front view of a fin in accordance with a fourth embodiment of the present invention.
Figure 9:
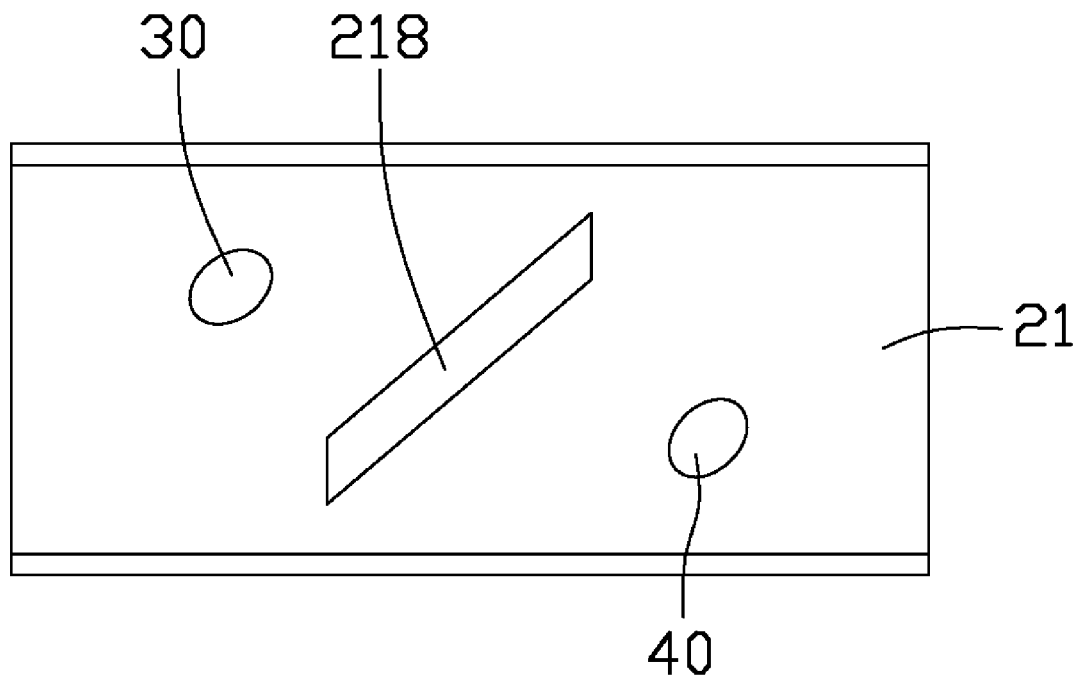
FIG. 9 is a front view of a fin in accordance with a fifth embodiment of the present invention.

Further embodiments of the present invention are shown in FIGS. 6-9. These embodiments show the heat pipes 30, 40 are inserted into holes (not labeled) defined in the fin 21. In FIG. 6, the protruding member 218 is located substantially at a central portion of the fin 21, and extends perpendicularly from the bottom flange 216 towards the top flange 216 of the fin 21. The protruding member 218 is located between the two heat pipes 30, 40. The heat pipes 30, 40 are located at same level. In FIGS. 7-8, the heat pipe 30 is located at a higher level than the heat pipe 40, and the protruding member 218 extends in a direction parallel to the bottom flange 216 and the top flange 216 of the fin 21. The two heat pipes 30, 40 shown in FIG. 7 are aligned in the vertical direction. The two heat pipes 30, 40 shown in FIG. 8 are non-aligned in the vertical direction. In FIG. 9, the two heat pipes 30, 40 are located at different levels, and the protruding member 218 extends from a lower, left corner of the fin 21 towards an upper, right corner of the fin 21.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fin assembly comprising:
    a plurality of fins stacked together with a flow channel formed between every two neighboring fins for an airflow flowing therethrough; and
    an elongated protruding member arranged substantially at a central portion of each of the fins and protruding above a front surface of the each of the fins, a recessed concave corresponding to the protruding member being defined in a rear surface of the each of the fins, a slit being defined along the protruding member and communicating with the concave, the protruding member dividing the each of the fins into first and second fin portions and blocking heat transfer between the first and second fin portions through the slit and the concave.

2. The fin assembly as described in claim 1, wherein the protruding member is U-shaped, and includes an elongated strip and two connecting tabs connecting two ends of the strip to the each of the fins.

3. The fin assembly as described in claim 1, wherein the protruding member is formed by punching the each of the fins from the rear surface towards the front surface thereof.

4. The fin assembly as described in claim 1, wherein another slit is defined along the protruding member, the slit and the another slit being located corresponding to windward and leeward sides of the airflow, respectively.

5. The fin assembly as described in claim 1, wherein the protruding member extends perpendicularly from a bottom flange towards a top flange of the each of the fins.

6. The fin assembly as described in claim 1, wherein the protruding member extends in a direction parallel to a bottom flange and a top flange of each of the fins.

7. The fin assembly as described in claim 1, wherein the protruding member extends from one corner of the each of the fins towards another corner of the each of the fins.

8. A thermal module comprising:
    a centrifugal fan defining an air outlet therein, an airflow generated by the fan leaving the fan through the air outlet;
    a fin assembly disposed at the air outlet and comprising a plurality of fins connected together, each fin having a front surface and a rear surface, a flow channel being defined between every two neighboring fins for the airflow flowing therethrough;
    a protruding member formed on the each fin and dividing the each fin into first and second fin portions, a recessed concave being defined in the each fin corresponding to the protruding member, a slit being defined along the protruding member and communicating with the concave, the protruding member blocking heat transfer between the first and second fin portions through the slit and the concave; and
    two heat pipes thermally connected with the first and second fin portions of the each fin, the two heat pipes being adapted for thermally connecting with two heat generating electronic components, respectively.

9. The thermal module as described in claim 8, wherein the protruding member is substantially U-shaped and comprises an elongated strip and two connecting tabs interconnecting two ends of the strip and a main body of the each fin.

10. The thermal module as described in claim 8, wherein another slit is defined along the protruding member, the slit and the another slit being located corresponding to windward and leeward sides of the airflow, respectively.

11. The thermal module as described in claim 8, wherein each of the heat pipes is flattened.

12. The thermal module as described in claim 8, wherein the each fin includes a main body and two flanges bent perpendicularly from top and bottom ends of the main body, respectively, the flanges at the top and bottom ends of the fins being connected together to form top and bottom contacting surfaces, respectively, the two heat pipes being attached to one of the top and bottom contacting surfaces.

13. The thermal module as described in claim 8, wherein one of the two heat generating electronic components is a CPU of a portable computer, and the other one of the two heat generating electronic components is a GPU of a VGA card for the portable computer.

14. The thermal module as described in claim 8, wherein the heat pipes are inserted into holes defined in the fins of the fin assembly.

15. The thermal module as described in claim 8, wherein the protruding member is located between the two heat pipes.

16. The thermal module as described in claim 8, wherein the protruding member is located substantially at a central portion of the each fin.

17. The thermal module as described in claim 8, wherein the two heat pipes are located at same level, and the protruding member extends perpendicularly from a bottom flange towards a top flange of the each fin.

18. The thermal module as described in claim 8, wherein one of the two heat pipes is located at a higher level than the other one of the two heat pipes, and the protruding member extends in a direction parallel to a bottom flange and a top flange of the each fin.

19. The thermal module as described in claim 18, wherein the two heat pipes in a vertical direction have one of the following arrangements: being aligned with each other and being non-aligned from each other.

20. The thermal module as described in claim 8, wherein the two heat pipes are located at different levels, and the protruding member extends from one corner of the each fin towards another corner of the each fin.

* * * * *